United States Patent
Weng

(10) Patent No.: US 9,390,476 B2
(45) Date of Patent: Jul. 12, 2016

(54) MAGNETIC RESONANCE IMAGING METHOD AND DEVICE ACHIEVING WATER/FAT SEPARATION

(71) Applicant: De He Weng, Shenzhen (CN)

(72) Inventor: De He Weng, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 38 days.

(21) Appl. No.: 13/927,359

(22) Filed: Jun. 26, 2013

(65) Prior Publication Data

US 2014/0003694 A1 Jan. 2, 2014

(30) Foreign Application Priority Data

Jun. 28, 2012 (CN) .......................... 2012 1 0218752

(51) Int. Cl.
| | |
|---|---|
| G06K 9/00 | (2006.01) |
| G06T 5/00 | (2006.01) |
| G01R 33/565 | (2006.01) |
| G01R 33/48 | (2006.01) |
| G01R 33/561 | (2006.01) |

(52) U.S. Cl.
CPC ............ *G06T 5/001* (2013.01); *G01R 33/4828* (2013.01); *G01R 33/56509* (2013.01); *G01R 33/4824* (2013.01); *G01R 33/5617* (2013.01)

(58) Field of Classification Search
None
See application file for complete search history.

(56) References Cited

U.S. PATENT DOCUMENTS

| | | | |
|---|---|---|---|
| 2005/0165296 A1* | 7/2005 | Ma ..................... | G01R 33/4828 600/410 |
| 2010/0117645 A1* | 5/2010 | Eggers et al. ................. | 324/309 |
| 2010/0195885 A1* | 8/2010 | Ma ................................ | 382/131 |
| 2011/0254547 A1 | 10/2011 | Reeder et al. | |
| 2011/0267054 A1* | 11/2011 | He et al. ........................ | 324/309 |
| 2011/0274331 A1 | 11/2011 | Weng | |
| 2012/0271155 A1* | 10/2012 | Stemmer ....................... | 600/413 |

FOREIGN PATENT DOCUMENTS

WO  WO 2008135885 A1 * 11/2008 ........... G01R 33/561

OTHER PUBLICATIONS

"Motion Correction With PROPELLER MRI: Application to Head Motion and Free-Breathing Cardiac Imaging," Pipe, Magn. Reson. Med., vol. 42, pp. 963-969 (1999).
"Breath-Hold Water and Fat Imaging Using a Dual-Echo Two-Point Dixon Technique With an Efficient and Robust Phase-Correction Algorithm," Ma, Magn. Reson. Med., vol. 52, pp. 415-419 (2004).

(Continued)

*Primary Examiner* — Weiwen Yang
(74) *Attorney, Agent, or Firm* — Schiff Hardin LLP

(57) ABSTRACT

In a magnetic resonance imaging method and apparatus for water/fat separation, a turbo spin echo BLADE (TSE BLADE) artifact correction sequence is executed to acquire original data for an in-phase image and original data for an opposite-phase image, and an in-phase image on the basis of the original data for the in-phase image and an opposite-phase image on the basis of the original data for the in-phase image and the original data for the opposite-phase image are reconstructed. Water and fat images are calculated on the basis of the reconstructed in-phase image and opposite-phase image. By using a TSE BLADE sequence to acquire k-space data, the advantage of the BLADE sequence of being insensitive to rigid body motion and pulsation is inherently present, thereby reducing sensitivity to motion artifacts while improving the image signal-to-noise ratio.

11 Claims, 5 Drawing Sheets

(56) References Cited

OTHER PUBLICATIONS

"Generalized k-Space Decomposition with Chemical Shift Correction for Non-Cartesian Water-Fat Imaging," Brodsky et al., Magn. Reson. Med., vol. 59, pp. 1151-1164 (2008).

"Iterative Decomposition of Water and Fat With Echo Asymmetry and Least-Squares Estimation (IDEAL): Application With Fast Spin-Echo Imaging," Reeder et al., Magn. Reson. Med., vol. 54, pp. 636-644 (2005).

"Water Fat Separation with TSE BLADE Based on Three Points Dixon Technique," Weng et al., ISMRM 18, 2925 (2010).

Ma et al., "Breath-Hold Water and Fat Imaging Using a Dual-Echo Two-Point Dixon Technique With an Efficient and Robust Phase-Correction Algorithm," Magnetic Resonance in Medicine, vol. 52 (2004), pp. 415-419.

\* cited by examiner

MAGNETIC RESONANCE IMAGING METHOD AND DEVICE ACHIEVING WATER/FAT SEPARATION

BACKGROUND OF THE INVENTION

1. Field of the Invention

The present invention relates to the technical field of magnetic resonance imaging, in particular to a magnetic resonance imaging method and device achieving water/fat separation.

2. Description of the Prior Art

Magnetic resonance imaging (MRI) is a technology which uses the phenomenon of magnetic resonance to perform imaging. The principles of the phenomenon of magnetic resonance mainly include: in atomic nuclei containing a single proton, such as the hydrogen atomic nuclei which are present throughout the human body, the protons have spin motion and as such resemble small magnets. Moreover, the spin axes of these small magnets have no definite regular pattern, and if an external magnetic field is applied, these small magnets will rearrange according to the magnetic force lines of the external magnetic field; specifically, they will rearrange in two directions, parallel or anti-parallel to the magnetic force lines of the external magnetic field. The direction parallel to the magnetic force lines of the external magnetic field is known as the positive longitudinal axis, while the direction anti-parallel to the magnetic force lines of the external magnetic field is known as the negative longitudinal axis. The atomic nuclei only have a longitudinal magnetization component, which has both a direction and a magnitude. A radio frequency (RF) pulse of a specific frequency is used to excite the atomic nuclei in the external magnetic field, so that the spin axes of these atomic nuclei deviate from the positive longitudinal axis or negative longitudinal axis, giving rise to resonance—this is the phenomenon of magnetic resonance. Once the spin axes of the above atomic nuclei have deviated from the positive longitudinal axis or negative longitudinal axis, the atomic nuclei have a transverse magnetization component.

After transmission of the RF pulse has stopped, the excited atomic nuclei emit an echo signal, releasing the absorbed energy gradually in the form of electromagnetic waves, and the phases and energy levels thereof all return to the pre-excitation state. An image can be reconstructed by subjecting the echo signal emitted by the atomic nuclei to further processing, such as spatial encoding.

Since the hydrogen atomic nuclei in fat and the hydrogen atomic nuclei in water inside the human body are in different molecular environments, they have different resonance frequencies when excitation is carried out using the same RF pulses. If signals are collected at different echo times, fat tissue and water display different phases and signal strengths.

Dixon methods are used to create a pure water proton image in MRI. The basic principle thereof is that two kinds of echo signals, in-phase and opposite-phase, of water protons and fat protons are collected separately; these two kinds of signal with different phases are subjected to an operation, each generating a pure water proton image and a pure fat proton image, thereby achieving the objective of fat suppression in the water proton image. There are many forms of Dixon method, including single-point Dixon methods, two-point Dixon methods, three-point Dixon methods and multi-point Dixon methods.

There are many types of k-space data acquisition method that are combined with Dixon methods in the art, for example Cartesian trajectory acquisition and radial or spiral trajectory acquisition, etc. It may be found through research that although existing Cartesian trajectory acquisition methods are simple and save time, they are very sensitive to movement, such as rigid body motion and pulsation. Radial or spiral trajectory acquisition methods, on the other hand, convert motion artifacts to fuzziness in the reconstructed image, involve complex calculation and are extremely time-consuming. Thus neither of the above two method types can eliminate rigid body motion artifacts.

In addition, existing three-point Dixon methods use phase unwrapping techniques to calculate water and fat images, and due to the intrinsic instability of phase unwrapping, the water and fat images calculated may be swapped. That is to say, when an image is theoretically believed to be a water image, the image actually calculated might be a fat image; and when an image is theoretically believed to be a fat image, the image actually calculated might be a water image. Therefore when an object to be imaged is subjected to multi-layer scanning, swapping of the water and fat images calculated may occur in some of the scanning layers, and this leads to errors in the synthesized three-dimensional water image and fat image.

SUMMARY OF THE INVENTION

An object of the present invention is to provide a magnetic resonance imaging method that achieves water/fat separation, to reduce sensitivity to motion artifacts during imaging and improve the signal-to-noise ratio.

The above object is achieved in accordance with the present invention by a magnetic resonance imaging method that achieves water/fat separation, that includes using a turbo spin echo BLADE (TSE BLADE) artifact correction sequence to acquire original data for an in-phase image and original data for an opposite-phase image, in a processor, reconstructing an in-phase image on the basis of the original data for the in-phase image, and reconstructing an opposite-phase image on the basis of the original data for the in-phase image and the original data for the opposite-phase image, and calculating water and fat images on the basis of the reconstructed in-phase image and the reconstructed opposite-phase image.

The embodiments of the present invention also encompass a magnetic resonance imaging device that achieves water/fat separation, that includes a magnetic resonance data acquisition unit operated by a control unit to execute a turbo spin echo BLADE (TSE BLADE) artifact correction sequence to acquire original data for an in-phase image and original data for an opposite-phase image, a first reconstruction unit that reconstructs an in-phase image on the basis of the original data for the in-phase image, a second reconstruction unit that reconstructs an opposite-phase image on the basis of the original data for the in-phase image and the original data for the opposite-phase image, and a calculation unit that separately calculates water and fat images on the basis of the reconstructed in-phase image and the reconstructed opposite-phase image.

By using a TSE BLADE sequence to acquire k-space data, the magnetic resonance imaging method achieving water/fat separation provided by the embodiments of the present invention inherits the advantage of the BLADE sequence in being insensitive to rigid body motion and pulsation, thereby reducing sensitivity to motion artifacts while improving the image signal-to-noise ratio.

DESCRIPTION OF THE PREFERRED EMBODIMENTS

Figure 1:
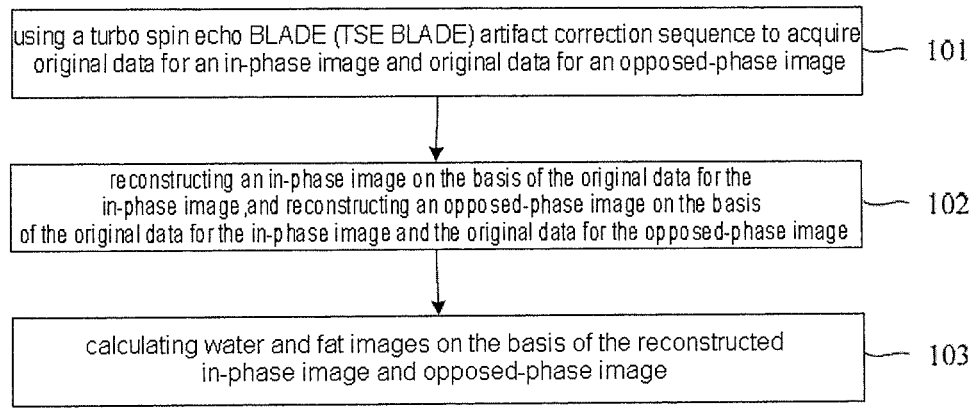
FIG. 1 is a schematic flow chart of the magnetic resonance imaging method achieving water/fat separation according to one embodiment of the present invention.

It may be found through research that although existing Cartesian trajectory acquisition methods are simple and save time, they are very sensitive to movement, such as rigid body motion and pulsation. Radial or spiral trajectory acquisition methods, on the other hand, convert motion artifacts to fuzziness in the reconstructed image, involve complex calculation and are extremely time-consuming. Thus neither of the above two method types can eliminate rigid body motion artifacts.

In addition, existing three-point Dixon methods use phase unwrapping techniques to calculate water and fat images, and due to the intrinsic instability of phase unwrapping, the water and fat images calculated may be swapped. That is to say, when an image is theoretically believed to be a water image, the image actually calculated might be a fat image; and when an image is theoretically believed to be a fat image, the image actually calculated might be a water image. Therefore when an object to be imaged is subjected to multi-layer scanning, swapping of the water and fat images calculated may occur in some of the scanning layers, and this leads to errors in the synthesized three-dimensional water image and fat image. For example, suppose a patient's head is being scanned in a total of 10 layers—layer 1, layer 2 . . . layer 10—from the top of the head to the lower jaw. When using an existing three-point Dixon method to calculate three-dimensional water and fat images of the patient's head, two-dimensional water images (from top to bottom, water image 1, water image 2 . . . water image 10) and two-dimensional fat images (from top to bottom, fat image 1, fat image 2 . . . fat image 10) of each of these 10 layers will first be obtained; a three-dimensional water image and a three-dimensional fat image will then be obtained by synthesizing the two-dimensional water images and fat images, respectively, of these 10 layers. If swapping of the two-dimensional water image 8 and two-dimensional fat image 8 of the 8th layer occurs, one two-dimensional fat image 8 will be mixed in with the two-dimensional water images of the 10 scanning layers, while one two-dimensional water image 8 will similarly be mixed in with the two-dimensional fat images of the 10 scanning layers. Thus when three-dimensional water and fat images are synthesized using the two-dimensional water images and fat images of the 10 scanning layers, errors will result in the synthesized water and fat images.

In order to solve the above technical problem, the embodiments of the present invention provide a magnetic resonance imaging method achieving water/fat separation, which is a two-point Dixon method based on a turbo spin echo BLADE (TSE BLADE) artifact correction sequence. In the method, a TSE BLADE sequence is first used to acquire original data for an in-phase image and original data for an opposite-phase image; then an in-phase image is reconstructed on the basis of the original data for the in-phase image, and an opposite-phase image is reconstructed on the basis of the original data for the in-phase image and the original data for the opposite-phase image; finally, water and fat images are calculated on the basis of the reconstructed in-phase image and opposite-phase image.

The magnetic resonance imaging method that achieves water/fat separation according to the embodiments of the present invention will be described in detail below with reference to the accompanying drawings. Refer to FIG. 1, which is a schematic flow chart for the magnetic resonance imaging method achieving water/fat separation provided in one embodiment of the present invention. The method specifically comprises the following steps:

Step 101: an MRI apparatus uses a turbo spin echo BLADE (TSE BLADE) artifact correction sequence to acquire original data for an in-phase image and original data for an opposite-phase image.

That is to say, in this step, the MRI apparatus uses a TSE BLADE sequence to acquire one in-phase echo as original data for an in-phase image, and one opposite-phase echo as original data for an opposite-phase image. Specifically, in this example, the MRI apparatus can acquire the in-phase echo first and then the opposite-phase echo, or acquire the opposite-phase echo first and then the in-phase echo.

The BLADE technique used in the above data acquisition is also known as the PROPELLER (Periodically Rotated Overlapping ParallEL Lines with Enhanced Reconstruction) technique; for details see James G. Pipe's paper "Motion Correction with PROPELLER MRI: Application to head motion and free-breathing cardiac imaging" (Magnetic Resonance in Medicine, 42: 963-969, November 1999). Since the BLADE sequence is insensitive to rigid body motion and pulsation, using the TSE BLADE sequence to acquire k-space data enables a reduction in the sensitivity of the reconstructed image to motion artifacts, as well as an improvement in the signal-to-noise ratio of the reconstructed image.

Figure 2:
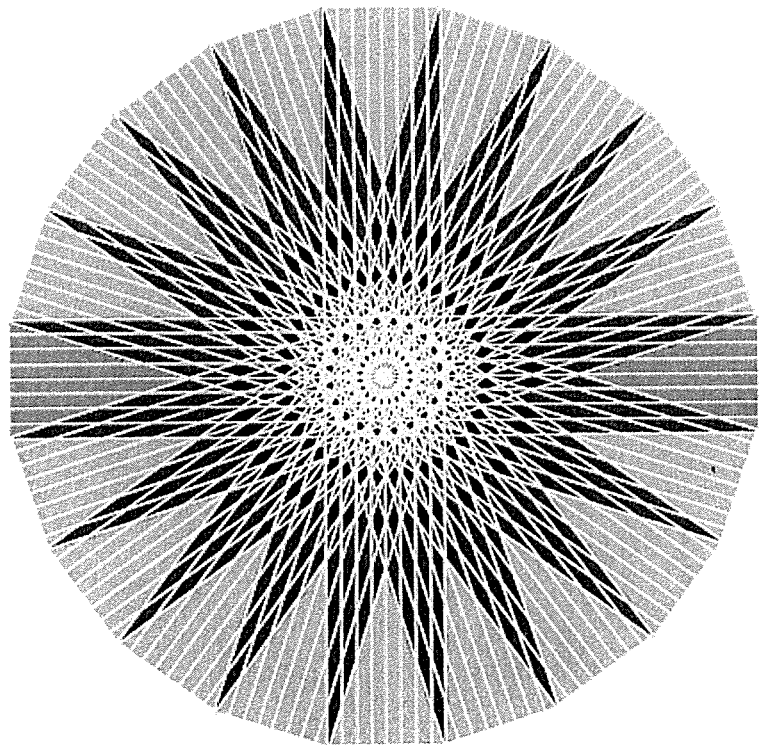
FIG. 2 is a schematic diagram of a BLADE trajectory.

The BLADE trajectory which acquires the original data for each image is shown in FIG. 2. K-space data is acquired in N strips (where N is a positive integer, N=10 in FIG. 2). These strips are distributed by rotating through equal or unequal angles in the circumferential direction. Each strip comprises L parallel lines (where L is a positive integer, L=9 in FIG. 2).

When acquiring echo signals in step 101 above, the MRI apparatus may use mono-polar readout gradients or bipolar readout gradients to successively obtain an in-phase image and an opposite-phase image.

Figure 3A:
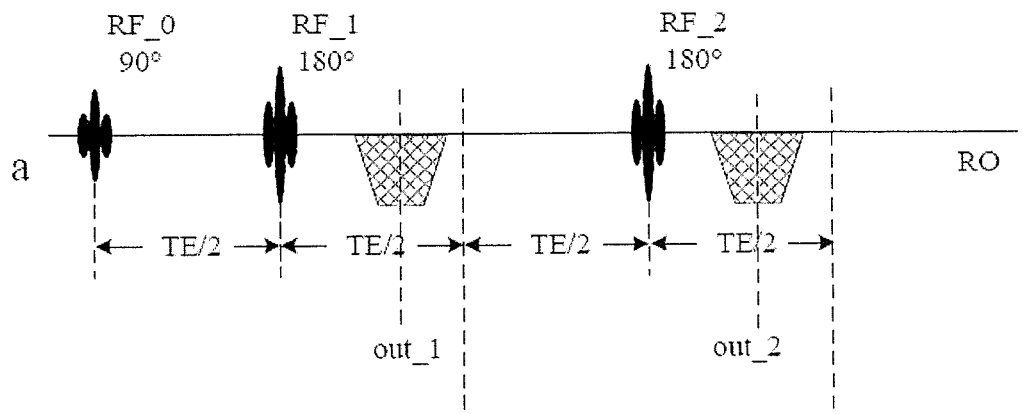
FIG. 3A shows sequence diagrams of mono-polar readout gradients in the magnetic resonance imaging method achieving water/fat separation according to one embodiment of the present invention.
Figure 3A:
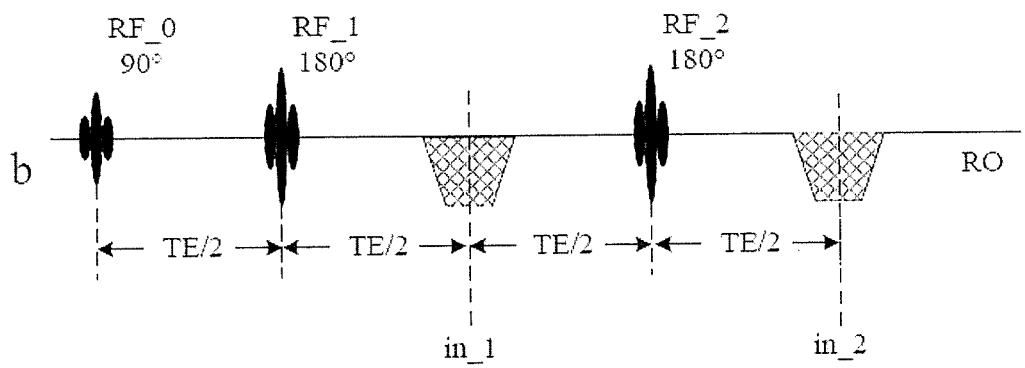
Figure 3B:
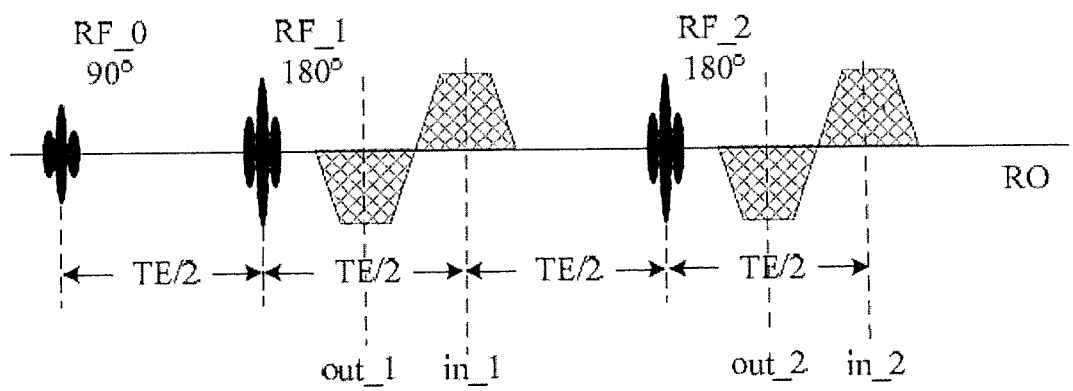
FIG. 3B is a sequence diagram of bipolar readout gradients in the magnetic resonance imaging method achieving water/fat separation according to one embodiment of the present invention.

FIGS. 3A and 3B show schematically the sequences in the method provided by the embodiments of the present invention during acquisition of each strip in the BLADE trajectory. FIG. 3A uses mono-polar readout gradients; FIG. 3B uses bipolar readout gradients. In FIGS. 3A and 3B, RF represents a radio frequency pulse and RO represents a readout gradient; slice-selection gradients and phase-encoding gradients have been omitted from the figures.

As part a in FIG. 3A shows, the MRI apparatus first emits one 90-degree RF pulse RF_0, then emits one 180-degree phase-refocusing RF pulse RF_1. Between one half of the echo time (time of echo, TE) and three halves of the echo time from the 90-degree RF pulse RF_0, the MRI apparatus applies a readout gradient in the readout gradient direction to read one line, out_1. The apparatus then emits another 180-degree phase-refocusing RF pulse RF_2 to obtain a second echo, and applies a readout gradient in the readout gradient direction to read another line, out_2. The above operations are repeated until all lines in the BLADE trajectory have been read, to obtain original data for an opposite-phase image. The lines out_1, out_2, out_3 . . . etc. constitute original data for an opposite-phase image.

As part b in FIG. 3A shows, the MRI apparatus first emits one 90-degree RF pulse RF_0, then emits one 180-degree phase-refocusing RF pulse RF_1. At one echo time from the 90-degree RF pulse RF_0, the MRI apparatus applies a readout gradient in the readout gradient direction to read one line, in_1. The apparatus then emits another 180-degree phase-refocusing RF pulse RF_2 to obtain a second echo, and applies a readout gradient in the readout gradient direction to read another line, in_2. The above operations are repeated until all lines in the BLADE trajectory have been read, to obtain original data for an in-phase image. The lines in_1, in_2, in_3 . . . etc. constitute original data for an in-phase image.

As FIG. 3B shows, the MRI apparatus first emits one 90-degree RF pulse RF_0, then emits one 180-degree phase-refocusing RF pulse RF_1. At one echo time from the 90-degree RF pulse RF_0, the MRI apparatus applies two readout gradients of different polarity in the readout gradient direction to read two lines, out_1 and in_1, respectively. The apparatus then emits another 180-degree phase-refocusing RF pulse RF_2 to obtain a second echo, and applies two readout gradients of different polarity in the readout gradient direction to read two lines, out_2 and in_2, respectively. The above operations are repeated until all lines in the BLADE trajectory have been read, to obtain original data for an opposite-phase image and original data for an in-phase image. The lines out 1, out_2, out_3 . . . etc. constitute original data for an opposite-phase image, while the lines in_1, in_2, in_3 . . . etc. constitute original data for an in-phase image.

It must be explained that FIGS. 3A and 3B merely show one kind of acquisition sequence in schematic form, to which the present invention is by no means limited. For example, in the present invention, first one in-phase echo and then one opposite-phase echo may be acquired, to obtain corresponding original data; alternatively, first one opposite-phase echo and then one in-phase echo may be acquired, to obtain corresponding original data.

Step 102: the MRI apparatus reconstructs an in-phase image on the basis of the original data for the in-phase image, and reconstructs an opposite-phase image on the basis of the original data for the in-phase image and the original data for the opposite-phase image.

In this step, when reconstructing an in-phase image, the MRI apparatus first subjects each in-phase image strip to phase correction, then subjects the phase-corrected in-phase image strips to rotation correction and translation correction in turn, and finally allocates all the corrected strips to Cartesian coordinates, and obtains an in-phase image by fast Fourier transform.

Figure 4:
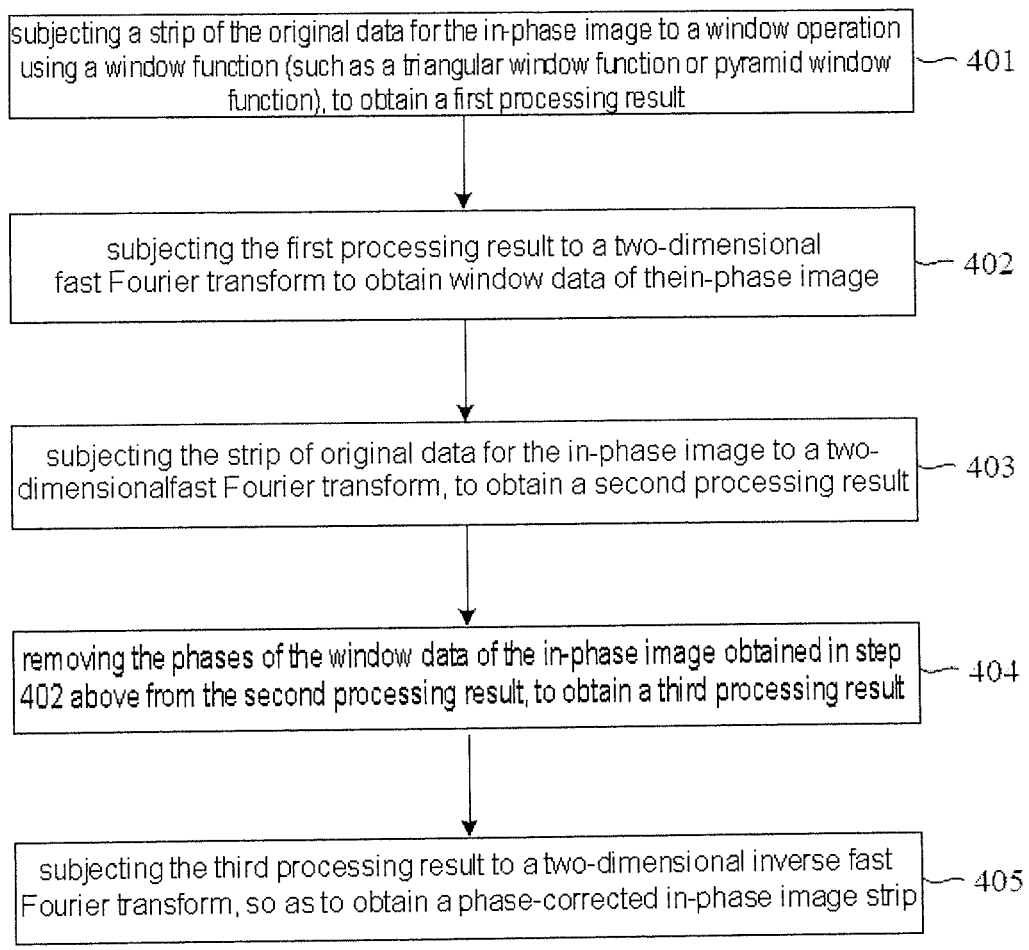
FIG. 4 is a schematic diagram showing the procedure for subjecting original data for an in-phase image to phase correction in the magnetic resonance imaging method achieving water/fat separation according to one embodiment of the present invention.

The procedure for subjecting each in-phase image strip to phase correction is shown in FIG. 4, and specifically comprises the following steps:

step 401: subjecting a strip of the original data for the in-phase image to a window operation using a window function (such as a triangular window function or pyramid window function), to obtain a first processing result;

step 402: subjecting the first processing result to a two-dimensional fast Fourier transform (2D FFT), to obtain a processing result which can be referred to as window data of the in-phase image;

step 403: subjecting the strip of original data for the in-phase image to a two-dimensional fast Fourier transform, to obtain a second processing result;

step 404: removing the phases of the window data of the in-phase image obtained in step 402 above from the second processing result obtained in step 403 above, to obtain a third processing result;

step 405: subjecting the third processing result to a two-dimensional inverse fast Fourier transform (2D iFFT), so as to obtain a phase-corrected in-phase image strip.

Figure 5:
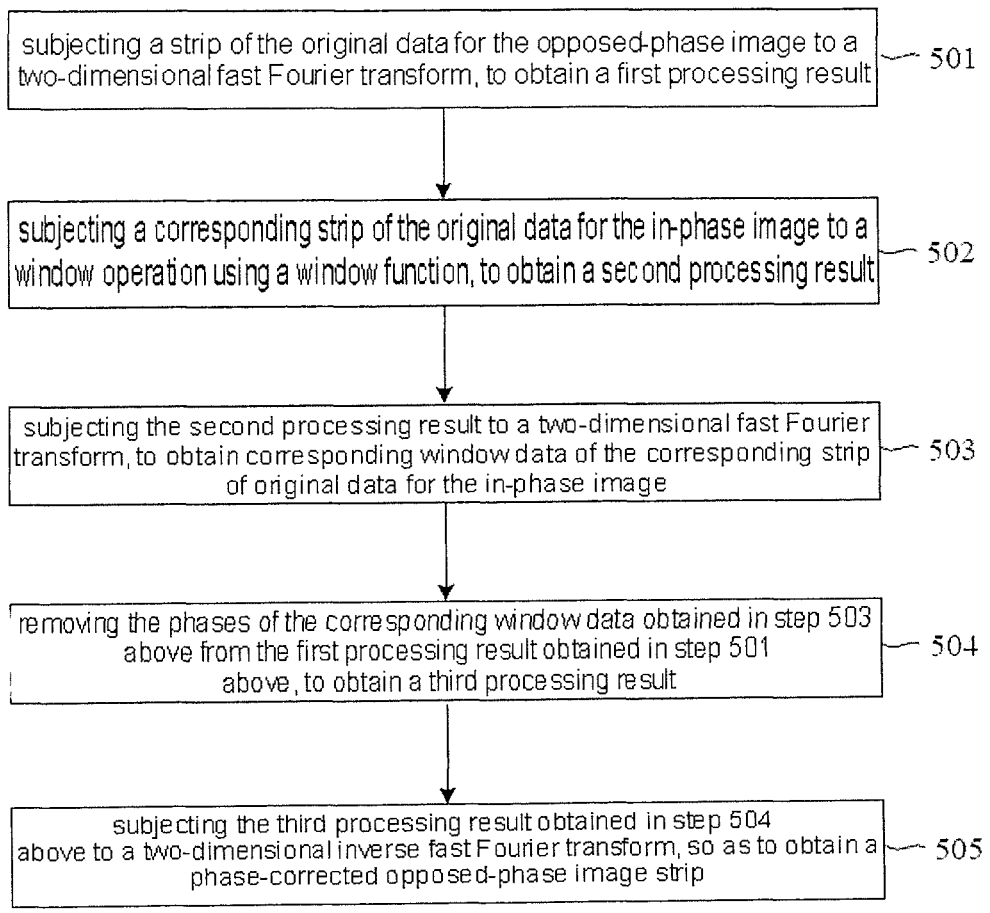
FIG. 5 is a schematic diagram showing the procedure for subjecting original data for an opposite-phase image to phase correction in the magnetic resonance imaging method achieving water/fat separation according to one embodiment of the present invention.

In this step, when reconstructing an opposite-phase image, the MRI apparatus first subjects each opposite-phase image strip to phase correction, then subjects the phase-corrected opposite-phase image strips to rotation correction and translation correction, and obtains an opposite-phase image by a fast Fourier transform. The inventor of the present invention has proposed an improvement to the method for subjecting the original data for the opposite-phase image to phase correction. As shown in FIG. 5, the method for subjecting each opposite-phase image strip to phase correction in the embodiments of the present invention specifically comprises the following steps:

step 501: subjecting a strip of the original data for the opposite-phase image to a two-dimensional fast Fourier transform, to obtain a first processing result;

step 502: subjecting a strip of the original data for the in-phase image corresponding to the strip of original data for the opposite-phase image (i.e. a strip of the original data for the in-phase image with the same angle in k-space as the strip of original data for the opposite-phase image) to a window operation using a window function, to obtain a second processing result;

step 503: subjecting the second processing result obtained in step 502 above to a two-dimensional fast Fourier transform, to obtain window data of the strip of original data for the in-phase image, referred to as corresponding window data;

step 504: removing the phases of the window data obtained in step 503 above of the strip of original data for the in-phase image from the first processing result obtained in step 501 above, to obtain a third processing result;

step 505: subjecting the third processing result obtained in step 504 above to a two-dimensional inverse fast Fourier transform, so as to obtain a phase-corrected opposite-phase image strip.

In the above procedure, the opposite-phase image strip is subjected to phase correction using an in-phase image strip as a reference; this preserves the opposite-phase information and thus enables imaging with water/fat separation to be carried out by a two-point Dixon method in the subsequent processing procedure.

Step 103: the MRI apparatus calculates a water image and a fat image separately on the basis of the reconstructed in-phase image and opposite-phase image.

In this step, when calculating water and fat images on the basis of the reconstructed in-phase image and opposite-phase image, in the case where the reconstructed in-phase image and opposite-phase image are two-dimensional images, a two-dimensional region growing algorithm is used to subject the reconstructed in-phase image and opposite-phase image to phase correction, and water and fat images are calculated on the basis of the phase-corrected in-phase image and opposite-phase image.

Moreover, to improve the reliability of calculation, the object to be imaged may be subjected to multi-layer scanning; that is to say, multiple two-dimensional in-phase images and opposite-phase images reflecting multiple scanning layers are obtained at the same time, and then on the basis of spatial information corresponding to the multiple two-dimensional in-phase images and opposite-phase images, the multiple two-dimensional in-phase images and opposite-phase images are arranged to form one three-dimensional in-phase image and one three-dimensional opposite-phase image. For example, when a patient's head is being scanned, a total of n layers are scanned—layer 1, layer 2 layer n—from the top of the head to the lower jaw. Two-dimensional in-phase images (from top to bottom, in-phase image 1, in-phase image 2 . . . in-phase image n) and two-dimensional opposite-phase images (from top to bottom, opposite-phase image 1, opposite-phase image 2 . . . opposite-phase image n) of each of these n layers are then obtained. Based on spatial information about these images, i.e. their order of arrangement from the top of the head to the lower jaw, the n two-dimensional in-phase images are arranged to form one three-dimensional in-phase image, while the n two-dimensional opposite-phase images are arranged to form one three-dimensional opposite-phase image. The three-dimensional in-phase image and three-dimensional opposite-phase image so obtained are then subjected to phase correction using any of a variety of existing methods, such as a three-dimensional region growing algorithm, which need not be elaborated superfluously here. Thus in the embodiments of the present invention, when the reconstructed in-phase image and opposite-phase image are three-dimensional images, the reconstructed in-phase image and opposite-phase image are subjected to phase correction using a three-dimensional region growing algorithm, and water and fat images are calculated on the basis of the phase-corrected in-phase image and opposite-phase image. The use of a three-dimensional region growing algorithm can effectively solve the problem of water and fat images being swapped in different scanning layers in traditional three-point Dixon methods, caused by the use of phase unwrapping techniques.

The object of the above phase correction is to remove phase errors caused by inhomogeneities in the magnetic field. Finally, the phase-corrected three-dimensional opposite-phase image and three-dimensional in-phase image are used to calculate a three-dimensional water image and three-dimensional fat image.

Figure 6:
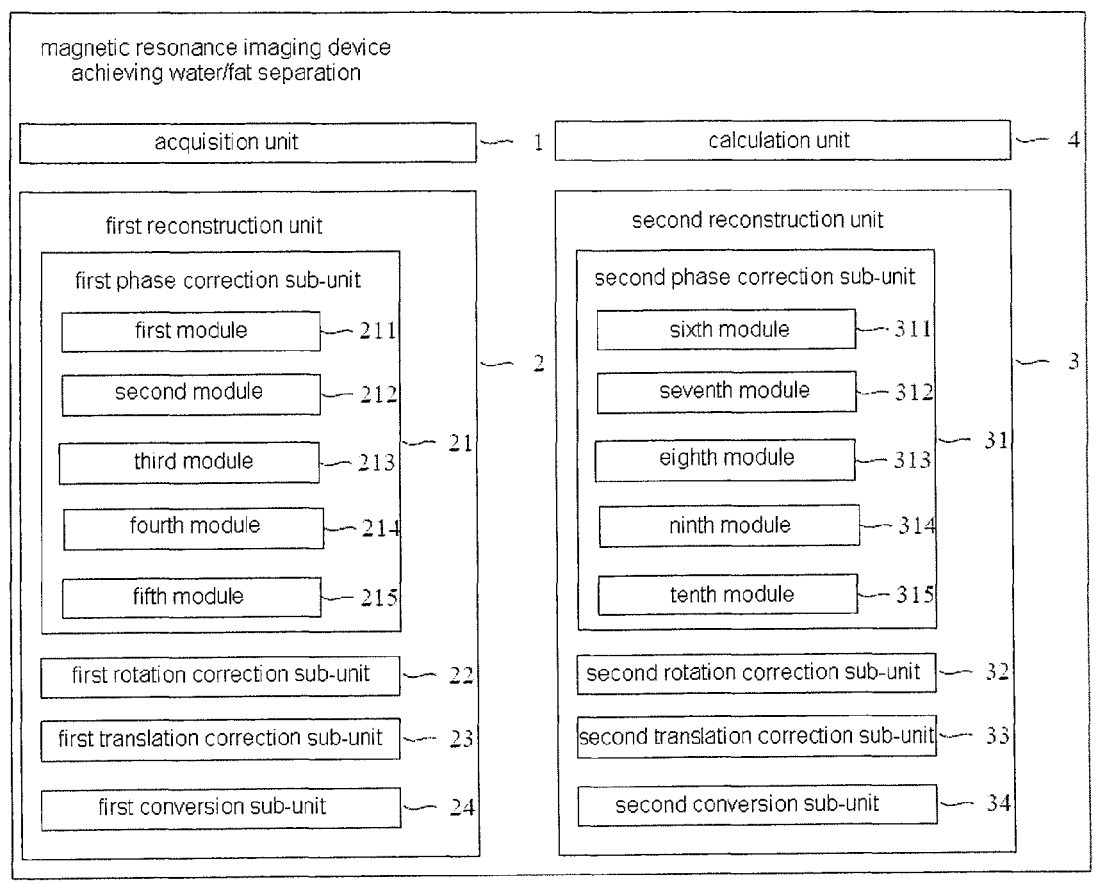
FIG. 6 is a schematic diagram showing the structure of the magnetic resonance imaging device achieving water/fat separation according to one embodiment of the present invention.

FIG. 6 is a schematic diagram showing the structure of the magnetic resonance imaging device achieving water/fat separation according to one embodiment of the present invention. The device includes:

an acquisition unit 1, for using a turbo spin echo BLADE (TSE BLADE) artifact correction sequence to acquire original data for an in-phase image and original data for an opposite-phase image;

a first reconstruction unit 2, for reconstructing an in-phase image on the basis of the original data for the in-phase image;

a second reconstruction unit 3, for reconstructing an opposite-phase image on the basis of the original data for the in-phase image and the original data for the opposite-phase image; and a calculation unit 4, for separately calculating water and fat images on the basis of the reconstructed in-phase image and opposite-phase image.

The first reconstruction unit 2 includes:
a first phase correction sub-unit 21, for subjecting strips of the original data for the in-phase image to phase correction;

a first rotation correction sub-unit 22, for subjecting phase-corrected strips of the original data for the in-phase image to rotation correction;

a first translation correction sub-unit 23, for subjecting rotation-corrected strips of the original data for the in-phase image to translation correction;

a first conversion sub-unit 24, for subjecting translation-corrected strips of the original data for the in-phase image to a fast Fourier transform.

The first phase correction sub-unit 21 specifically includes:
a first module 211, for subjecting strips of the original data for the in-phase image to a window operation to obtain a first processing result;

a second module 212, for subjecting the first processing result to a two-dimensional fast Fourier transform, to obtain window data of the in-phase image;

a third module 213, for subjecting strips of the original data for the in-phase image to a two-dimensional fast Fourier transform, to obtain a second processing result;

a fourth module 214, for removing the phases of the window data of the in-phase image from the second processing result to obtain a third processing result;

a fifth module 215, for subjecting the third processing result to a two-dimensional inverse fast Fourier transform to obtain the correction result.

The second reconstruction unit 3 includes:
a second phase correction sub-unit 31, for subjecting strips of the original data for the in-phase image to phase correction;

a second rotation correction sub-unit 32, for subjecting phase-corrected strips of the original data for the in-phase image to rotation correction;

a second translation correction sub-unit 33, for subjecting rotation-corrected strips of the original data for the in-phase image to translation correction;

a second conversion sub-unit 34, for subjecting translation-corrected strips of the original data for the in-phase image to a fast Fourier transform.

The second phase correction sub-unit 31 specifically includes:
a sixth module 311, for subjecting strips of the original data for the opposite-phase image to a two-dimensional fast Fourier transform to obtain a first processing result;

a seventh module 312, for subjecting strips of the original data for the in-phase image corresponding to the strips of the original data for the opposite-phase image to a window operation to obtain a second processing result;

an eighth module 313, for subjecting the second processing result to a two-dimensional fast Fourier transform, to obtain window data of the corresponding strips of the original data for the in-phase image;

a ninth module 314, for removing the phases of the window data of the strips of the original data for the in-phase image from the first processing result to obtain a third processing result;

a tenth module 315, for subjecting the third processing result to a two-dimensional inverse fast Fourier transform to obtain the correction result.

The embodiments of the present invention, by using a TSE BLADE sequence to acquire k-space data inherently have the advantage of the BLADE sequence in being insensitive to rigid body motion and pulsation, thereby reducing sensitivity to motion artifacts while improving the image signal-to-noise ratio.

Furthermore, compared with existing three-point Dixon methods, the present invention eliminates the problem that irregular swapping of water and fat images often occurs in multi-layer scanning, by using a two-dimensional region growing algorithm or three-dimensional region growing algorithm to reconstruct images.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance imaging method achieving water/fat separation, the method comprising:
    for each scanning layer of multiple scanning layers, operating a magnetic resonance data acquisition unit to execute a turbo spin echo BLADE artifact correction sequence to acquire original data for an in-phase image and original data for an opposite-phase image;
    in a processor, reconstructing an in-phase image on the basis of the original data for the in-phase image, and reconstructing an opposite-phase image on the basis of the original data for the in-phase image and the original data for the opposite-phase image; and
    in said processor, calculating water and fat images on the basis of the reconstructed in-phase images and the reconstructed opposite-phase images of the multiple scanning layers, and making the in-phase image and the opposite-phase image available at an output of the processor as respective data files, wherein calculating water and fat images comprises:
        on the basis of spatial information corresponding to multiple two-dimensional in-phase images and opposite-phase images, the multiple two-dimensional in-phase images and opposite-phase images arranging to form one three-dimensional in-phase image and one three-dimensional opposite-phase image;
        subjecting the three-dimensional in-phase image and three-dimensional opposite-phase image to phase correction; and
        calculating water and fat images on the basis of the phase-corrected in-phase images and the phase-corrected opposite-phase images of the multiple scanning layers.

2. The method as claimed in claim 1, comprising reconstructing an in-phase image on the basis of the original data for the in-phase image by:
    subjecting strips of the original data for the in-phase image to phase correction, rotation correction, translation correction and a fast Fourier transform to obtain the in-phase image.

3. The method as claimed in claim 2, comprising subjecting strips of the original data for the in-phase image to phase correction by:
    subjecting a strip of the original data for the in-phase image to a window operation to obtain a first processing result;
    subjecting the first processing result to a two-dimensional fast Fourier transform, to obtain window data of the in-phase image;
    subjecting the strip of original data for the in-phase image to a two-dimensional fast Fourier transform, to obtain a second processing result;
    removing the phases of the window data of the in-phase image from the second processing result to obtain a third processing result; and
    subjecting the third processing result to a two-dimensional inverse fast Fourier transform to obtain a correction result.

4. The method as claimed in claim 1, comprising reconstructing an opposite-phase image on the basis of the original data for the in-phase image and the original data for the opposite-phase image by:
    subjecting strips of the original data for the opposite-phase image to phase correction, rotation correction, translation correction and a fast Fourier transform to obtain the opposite-phase image.

5. The method as claimed in claim 4, comprising subjecting strips of the original data for the opposite-phase image to phase correction by:
    subjecting a strip of the original data for the opposite-phase image to a two-dimensional fast Fourier transform, to obtain a first processing result;
    subjecting a strip of the original data for the in-phase image corresponding to the strip of original data for the opposite-phase image to a window operation, to obtain a second processing result;
    subjecting the second processing result to a two-dimensional fast Fourier transform, to obtain window data of the strip of original data for the in-phase image;
    removing the phases of the window data of the strip of original data for the in-phase image from the first processing result, to obtain a third processing result; and
    subjecting the third processing result to a two-dimensional inverse fast Fourier transform, to obtain a correction result.

6. A magnetic resonance imaging device achieving water/fat separation, the device comprising:
    a magnetic resonance data acquisition unit;
    a control unit configured to operate the acquisition unit, for each scanning layer of multiple scanning layers, to execute a turbo spin echo BLADE artifact correction sequence to acquire original data for an in-phase image and original data for an opposite-phase image;
    a processor comprising a first reconstruction unit configured to reconstruct an in-phase image on the basis of the original data for the in-phase image;
    said processor comprising a second reconstruction unit configured to reconstruct an opposite-phase image on the basis of the original data for the in-phase image and the original data for the opposite-phase image;
    said processor comprising a calculation unit configured to separately calculate water and fat images on the basis of the reconstructed in-phase images and the reconstructed opposite-phase images, and to make the in-phase image and the opposite-phase image available at an output of the calculation unit as respective data files; and
    said calculation unit being configured to calculate said water and fat images by, on the basis of spatial information corresponding to multiple two-dimensional in-phase images and opposite-phase images, arranging the multiple two-dimensional in-phase images and opposite-phase images to form one three-dimensional in-phase image and one three-dimensional opposite-phase image, and subjecting said three-dimensional in-phase image and said three-dimensional opposite-phase image to phase correction, and calculating the water and fat images based on the phase-corrected in-phase images and the phase-corrected opposite-phase images of the multiple scanning layers.

7. The device as claimed in claim 6, wherein the first reconstruction unit comprises:
    a first phase correction sub-unit configured to subject strips of the original data for the in-phase image to phase correction;

a first rotation correction sub-unit configured to subject phase-corrected strips of the original data for the in-phase image to rotation correction;

a first translation correction sub-unit configured to subject rotation-corrected strips of the original data for the in-phase image to translation correction; and a first conversion sub-unit configured to subject translation-corrected strips of the original data for the in-phase image to a fast Fourier transform.

8. The device as claimed in claim 7, wherein the first phase correction sub-unit comprises:

a first module configured to subject strips of the original data for the in-phase image to a window operation to obtain a first processing result;

a second module configured to subject the first processing result to a two-dimensional fast Fourier transform, to obtain window data of the in-phase image;

a third module configured to subject strips of the original data for the in-phase image to a two-dimensional fast Fourier transform, to obtain a second processing result;

a fourth module configured to remove the phases of the window data of the in-phase image from the second processing result to obtain a third processing result; and a fifth module configured to subject the third processing result to a two-dimensional inverse fast Fourier transform to obtain a correction result.

9. The device as claimed in claim 6, wherein the second reconstruction unit comprises:

a second phase correction sub-unit configured to subject strips of the original data for the in-phase image to phase correction;

a second rotation correction sub-unit configured to subject phase-corrected strips of the original data for the in-phase image to rotation correction;

a second translation correction sub-unit configured to subject rotation-corrected strips of the original data for the in-phase image to translation correction; and a second conversion sub-unit configured to subject translation-corrected strips of the original data for the in-phase image to a fast Fourier transform.

10. The device as claimed in claim 9, wherein the second phase correction sub-unit comprises:

a sixth module configured to subject strips of the original data for the opposite-phase image to a two-dimensional fast Fourier transform to obtain a first processing result;

a seventh module configured to subject strips of the original data for the in-phase image corresponding to the strips of the original data for the opposite-phase image to a window operation to obtain a second processing result;

an eighth module configured to subject the second processing result to a two-dimensional fast Fourier transform, to obtain window data of the strips of the original data for the in-phase image;

a ninth module configured to remove the phases of the window data of the strips of the original data for the in-phase image from the first processing result to obtain a third processing result; and a tenth module configured to subject the third processing result to a two-dimensional inverse fast Fourier transform to obtain a correction result.

11. The method as claimed in claim 1, comprising phase-correcting the three-dimensional in-phase image and the three-dimensional opposite-phase image using a three-dimensional region growing algorithm.

\* \* \* \* \*